United States Patent
Sawyer

(10) Patent No.: US 6,548,321 B1
(45) Date of Patent: Apr. 15, 2003

(54) METHOD OF ANODICALLY BONDING A MULTILAYER DEVICE WITH A FREE MASS

(75) Inventor: William David Sawyer, Lexington, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 10/004,145

(22) Filed: Oct. 23, 2001

(51) Int. Cl.$^7$ .............................................. H01L 21/00
(52) U.S. Cl. ........................................... 438/50; 438/51
(58) Field of Search .............................. 438/48, 50, 51, 438/52, 53, 455, 456, 458

(56) References Cited

FOREIGN PATENT DOCUMENTS

EP          0 280 905 A  *  9/1988     ............. G01L/9/06

OTHER PUBLICATIONS

N. Ito et al., "A Rapid and Selective Anodic Bonding Method", Jun. 1995, Transducers '95—Eurosensors IX, pp. 227–280.*

* cited by examiner

Primary Examiner—Kamand Cuneo
Assistant Examiner—Evan Pert
(74) Attorney, Agent, or Firm—Iandiorio & Teska; R. Stephen Rosenholm; Kirk Teska

(57) ABSTRACT

A method of anodically bonding a multilayer device with a free mass includes positioning a support layer on either side of a free mass structure including a free mass with an electrode on each layer proximate the free mass; connecting both electrodes and the free mass to a node at a floating potential and applying a voltage across the layers and free mass structure to bond at least one of the layers to the free mass structure.

9 Claims, 6 Drawing Sheets

METHOD OF ANODICALLY BONDING A MULTILAYER DEVICE WITH A FREE MASS

FIELD OF THE INVENTION

This invention relates to a method for anodically bonding a multilayer device with a free proof mass or other mass.

BACKGROUND OF THE INVENTION

MEMS devices with free proof masses such as accelerometers and gyroscopes typically mount the free proof mass structure to the base layer using anodic bonding. The base layer typically includes a sense plate or electrode to sense the movement of the proof mass. Anodic bonding applies a high voltage e.g. 1000 volts across the free proof mass structure and base layer to effect the bond. In order to prevent the high voltage from attracting and bonding the free proof mass to the base layer, the free proof mass is kept in its bulk form until after the anodic bonding: the strength of the unfinished free proof mass structure is sufficient to prevent it from being flexed or drawn into contact with the base layer. Then, after bonding, the bulk of the free proof mass structure is removed leaving the suspended free proof mass. In order to improve the signal sensed from the motion of the proof mass a second, top, layer with another sense plate or electrode is mounted on the other side of the free proof mass opposite the base layer. Now any motion of the proof mass is sensed by both sense plates effectively doubling the signal strength. However, anodic bonding of this second layer presents a problem because now the proof mass is indeed free and applying the anodic bonding voltage across the layers will cause the free proof mass to be attracted and bonded to one of the layers. To combat this problem it has been suggested to ground the sense plates and the proof mass to prevent the attraction and bonding of the proof mass during anodic bonding. N. Ito, K. Yamada, H. Okada, M. Nishimura, T. Kuriyama, A Rapid and Selective Anodic Bonding Method, International Conference on Solid-State Sensors and Actuators, And Eurosensors IX, Proceedings V1, pg. 227–280, 1995. However, this solution introduces a substantial increase in complexity in the manufacturing process. Both the base and top sense plates must be connected to ground potential. In order to do this holes or vias must be made in the base and top layers, typically glass, which support the sense plates. These vias must be filled with metal or some conductor in order to establish an electrical connection between the sense plates and ground. In addition the proof mass, usually made of silicon must also be electrically connected to ground. All three of these electrical connections are difficult to effect and require several processing steps which add cost to the device. All of these vias and connections must be provided for each chip on a wafer which contains hundreds or even thousands of said chips. Further, after fabrication these ground connections must be removed to ensure reliable operation.

BRIEF SUMMARY OF THE INVENTION

It is therefore an object of this invention to provide an improved method of anodically bonding a multilayer device with a free mass.

It is a further object of this invention to provide such an improved method of anodically bonding a multilayer device with a free mass which requires no additional, external vias or connections.

It is a further object of this invention to provide such an improved method of anodically bonding a multilayer device with a free mass which dramatically reduces complexity and increases yield.

It is a further object of this invention to provide such an improved method of anodically bonding a multilayer device with a free mass which requires no extra step in processing to undo connections.

This invention results from the realization that the free mass can be prevented from unwanted attachment during anodic bonding not just by grounding the effected parts which requires complex and potentially problematic connections and added processing steps but by simply electrically connecting the effected parts together internally to a floating potential which is easily cut when the wafer is diced into chips and more particularly that a multilayer device with a free mass can be more easily and simply anodically bonded by positioning a support layer on either side of the free mass with an electrode on each layer proximate the free mass, connecting both electrodes and the free mass, to a node at a floating potential and applying a voltage across the layers and more to bond at least one of the layers to the silicon layer.

This invention features a method of anodically bonding a multilayer device with a free mass including positioning a support layer on either side of a free mass structure which includes a free mass. There is an electrode on each layer proximate the free mass. Both electrodes and the free mass are connected to a node at a floating potential. A voltage is applied across the layers and the free mass structure to bond at least one of the layers to the free mass structure.

In a preferred embodiment the free mass may be a proof mass. The layers and free mass may include different materials. The layers may include glass and the free mass may include silicon. The node may be contiguous with the multilayer device. The multilayer device may be one of a plurality formed in a wafer structure. Each multilayer device may have a node associated with it. The wafer structure may be diced into individual multilayer devices and the dicing may disconnect the layers and free mass from the floating potential node. The wafer structure may include two wafers which form the support layers with a third wafer between them forming the free mass structure.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
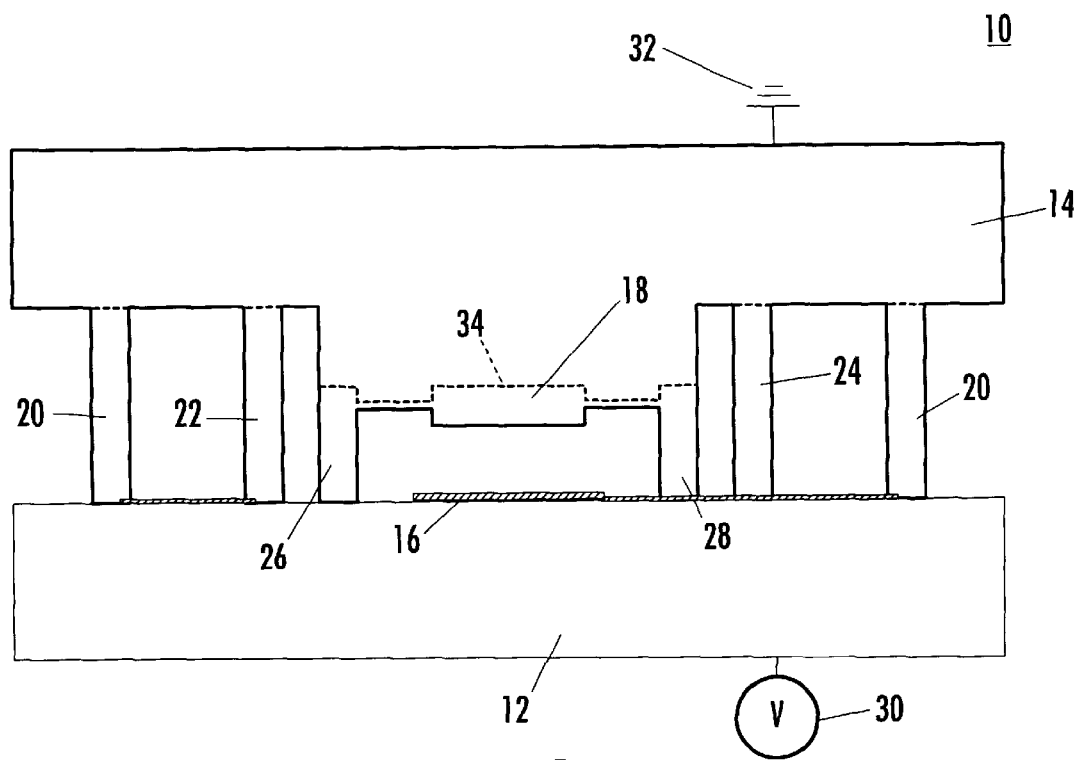
FIGS. 1, 2, and 3 illustrate the basic steps in anodic bonding of a multilayer device having a free mass.
Figure 2:
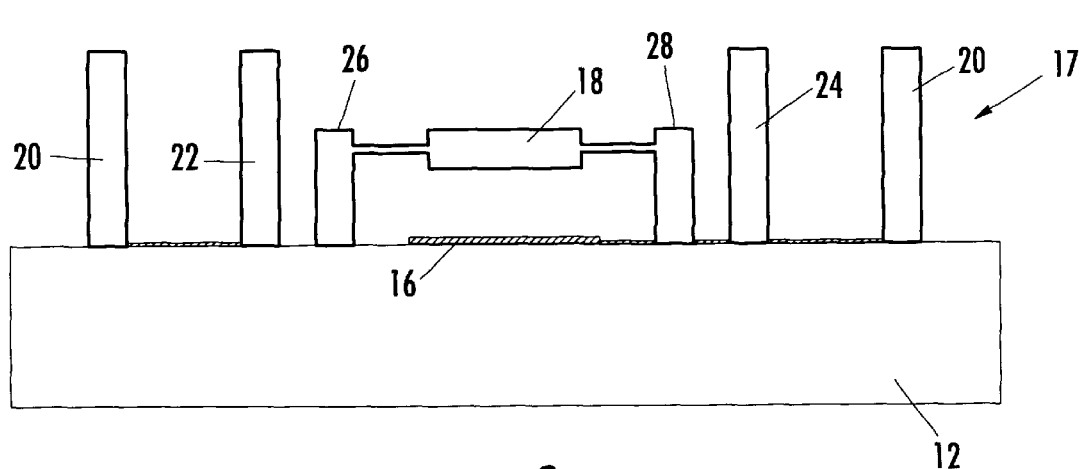
Figure 3:
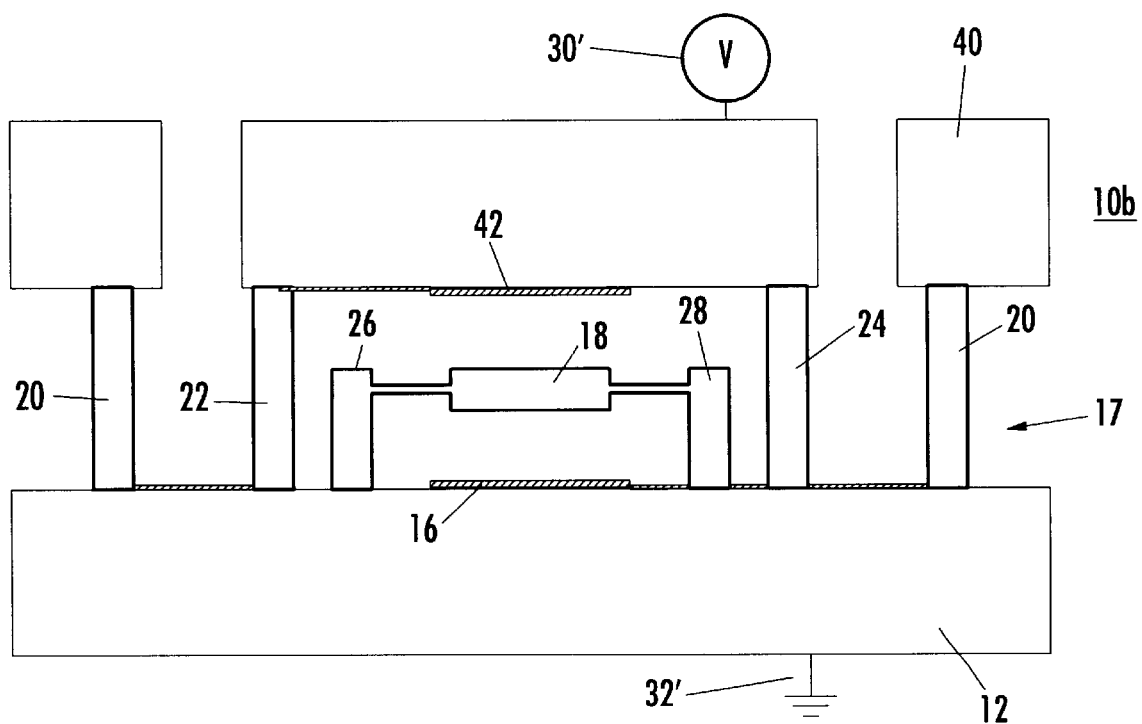

There is shown in FIGS. 1, 2, and 3 the broad steps in making an anodically bonded multilayer device 10 with a free mass. As shown in FIG. 1 there is a lower support layer 12 and free mass bulk plate 14 having substantial bulk. Typically lower support plate 12 is made of glass and contains sense plate or electrode 16 for sensing the electric field associated with the movement of free mass 18 shown still imbedded as a part of the free mass bulk plate 14. Free mass bulk plate 14 is typically silicon and provides scribe line 20 which forms the outer boundary of device 10. Also made of silicon are posts 22 and 24 and anchors 26 and 28 which will eventually form a part of the free mass structure 17 along with free mass 18. The anodic bonding is accomplished by applying a high voltage such as at terminal 30 to layer 12 and grounding such as at terminal 32 free mass bulk plate 14. The sheer bulk of plate 14 prevents the unfinished free mass 18 from being drawn down towards sense plate 16 and layer 12 where it too would become bonded, damaged and probably require the entire device 10 to be discarded lowering the yield.

After the bonding takes place, an etching is done so that all of the free mass bulk plate 14, typically made of silicon, is removed above the dashed line indicated at 34 leaving just the free mass structure 17. All of the material that is above the cross hatch would then be removed. The resultant device 10a is shown in FIG. 2. In a multilayer device a second upper support layer 40, FIG. 3 is added which rests on scribe line 20 and posts 22 and 24. Layer 40 also may be made of glass and includes another electrode or sense plate 42.

Anodic bonding may now be applied again through a voltage, typically 1000 volts applied at 30' at support layer 40 while support layer 12 is grounded as at 32'. While in the description of FIGS. 1, 2, and 3 anodic bonding takes place first as shown at FIG. 1 with respect to layer 12 and then a second time as shown in FIG. 3 with respect to layer 40. This is not a necessary limitation of the invention. For example the anodic bonding in FIG. 1 of layer 12 can be delayed, and both layers 12 and 40 can be anodically bonded at the same time, for example in the condition shown in FIG. 3. It should also be noted that while a single multilayer device 10, 10a and 10b is described here, in fact, a plurality of them, typically as many as a hundred or more are made simultaneously in which case layers 12 and 40 are actually constituted by large glass wafers and the silicon layer in between is a third large wafer so that in fact there is a triple stack wafer on which many of these devices 10 are made simultaneously.

A problem arises because when the anodic bonding voltage is applied, as shown in FIG. 3, free mass 18 in free mass structure 17 is truly free and can swing in either direction toward layer 12 or layer 40 where it too will become bonded and damaged and destroy the usability of the device 10. In order to prevent this in the prior art each of the layers, 12 and 40, and free mass 18 are connected to ground. This adds additional complexity and processing steps to the fabrication process.

Figure 4:
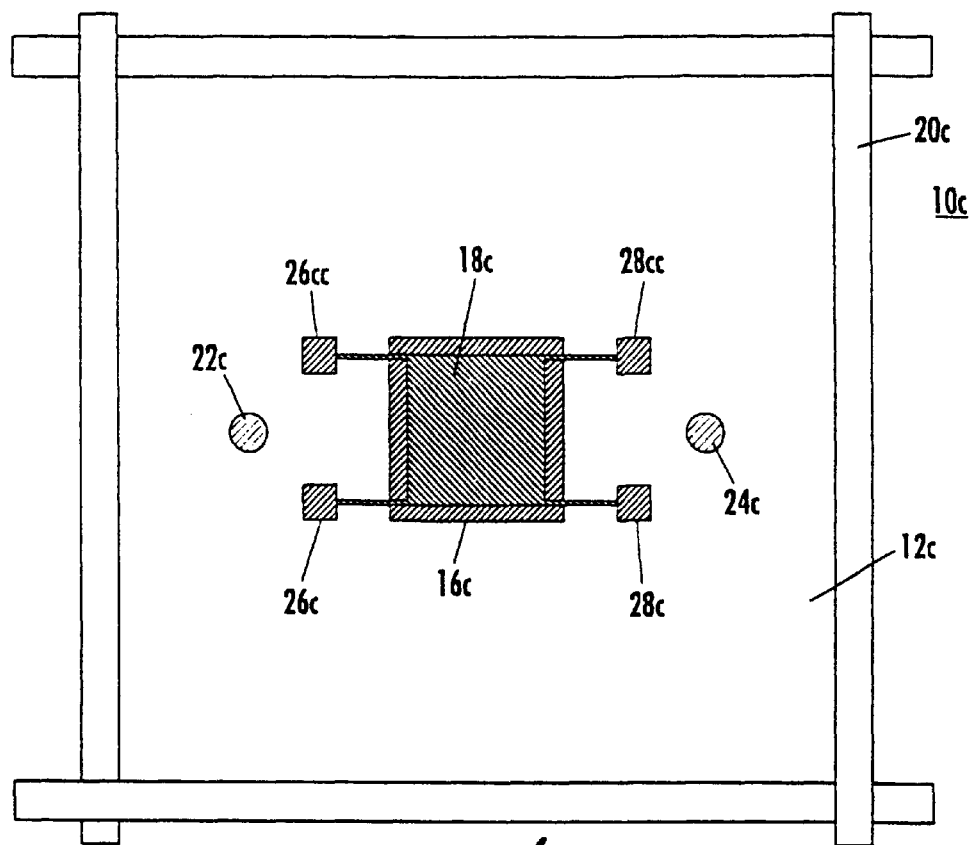
FIG. 4 is a schematic top plan view of a prior art device for preventing the free mass from inadvertently bonding during the bonding of the layers.
Figure 5:
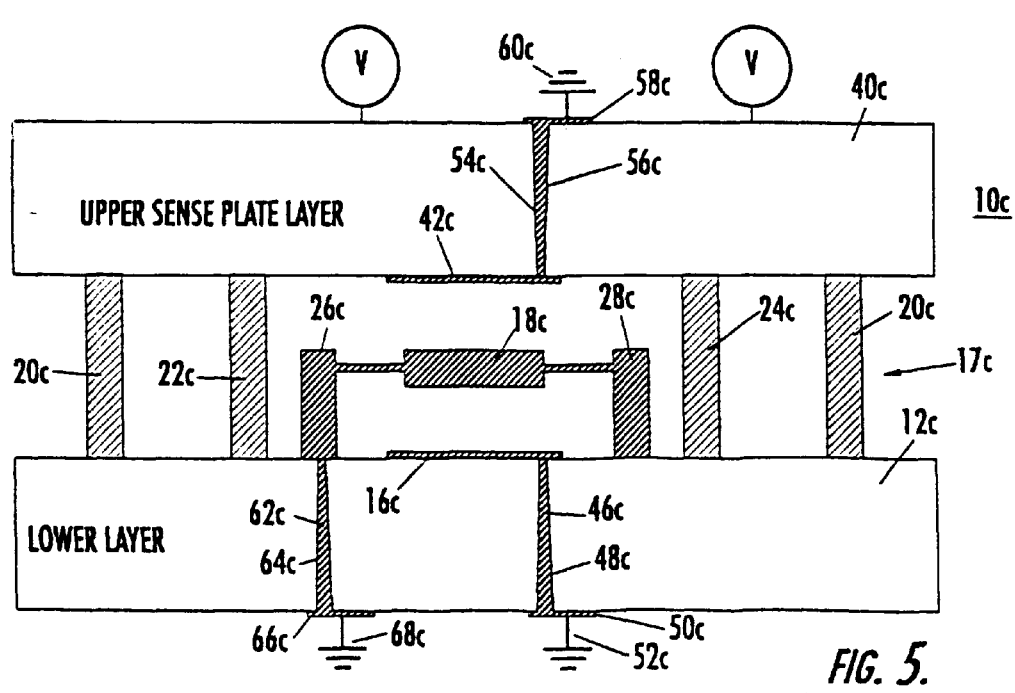
FIG. 5 is a schematic side elevational view of the prior art device of FIG. 4.

Such a technique is shown in FIGS. 4 and 5. In this case a single multilayer device 10c, FIGS. 4 and 5 includes scribe line 20c which is actually the position for the saw cut or kerf when the chips are sawed or diced from the wafer. A seal ring is also present for the purposes of supporting and sealing each device individually. The seal ring is not shown here for purpose of clarity, but it is well understood by those skilled in the art. Included in free mass structure 17 is free mass 18c supported on four anchors, 26c, 26cc, 28c and 28cc; also included are silicon posts 22c and 24c. The electrode or sense plate 16c can be seen beneath free mass 18c. In order to make the connections to ground, this prior art technique requires that each of the electrode or sense plates 16c and 42c and the free mass 18c must be connected to ground. Electrode or sense plate 16c is connected to ground by connecting it through conductor 46c in via 48c, which then connects to contact pad 50c and then to ground 52c. Similarly electrode or sense plate 42c is connected to conductor 54c in via 56c, to contact pad 58c and then to ground at 60c. And free mass 18c is connected to conductor 62c in via 64c, to contact pad 66c and then to ground at 68c. Thus, for each of the three connections processing steps must be added in order to create the vias, fill the vias, connect them to the outside contacts and then connect the outside contacts to ground. These outside or external contacts are off-wafer so that each of these grounds shown at 52c, 60c and 68c are not proximate the device or individual chip but must be brought across the wafer somehow with all the similar triple ground connections from each of the other multilayer devices to some ground point off the entire wafer. This makes for an extremely complex and drawn out fabrication process and since there are so many additional steps the reliability suffers and the yield is naturally lower. In addition, a separate step or steps must be taken after the processing is complete to sever these connections from ground so that the system can operate as intentioned.

Figure 6:
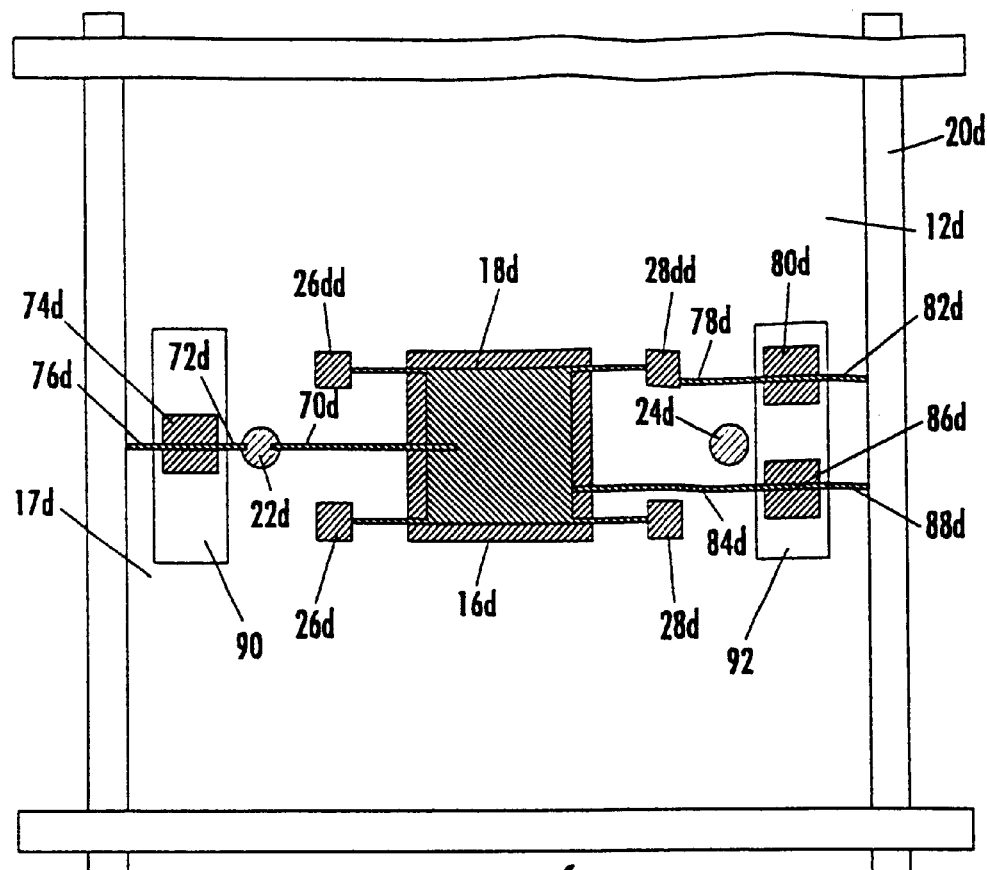
FIGS. 6 and 7 are views similar to FIGS. 4 and 5 of a new improved technique according to this invention for anodic bonding of a multilayer device with a free mass.
Figure 7:
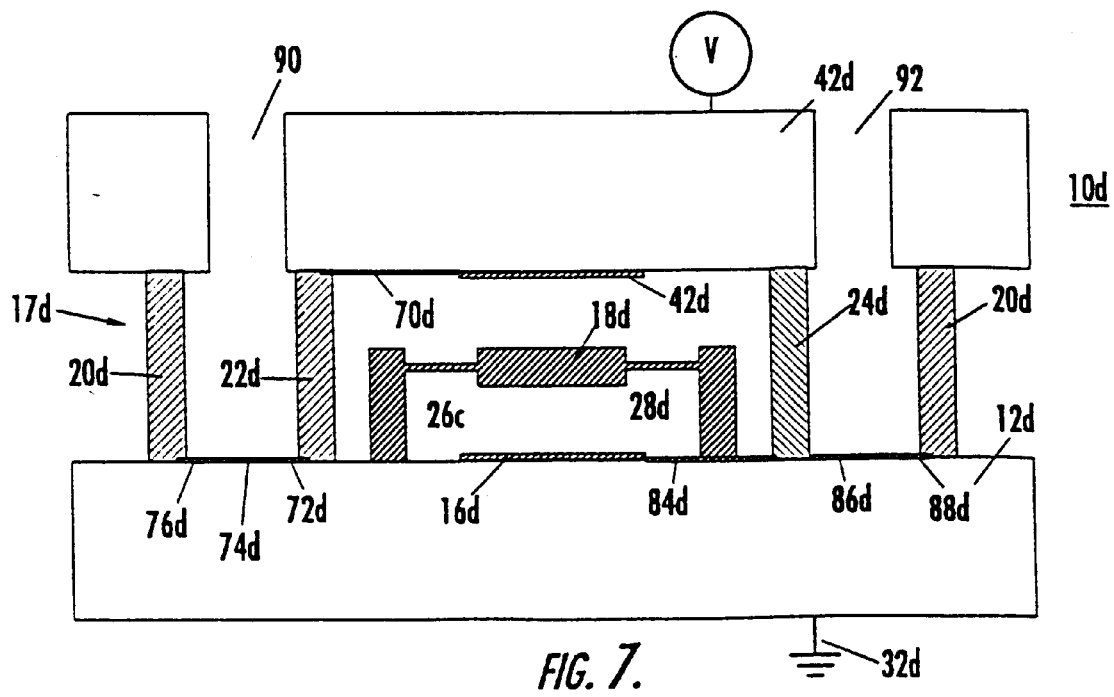
Figure 8:
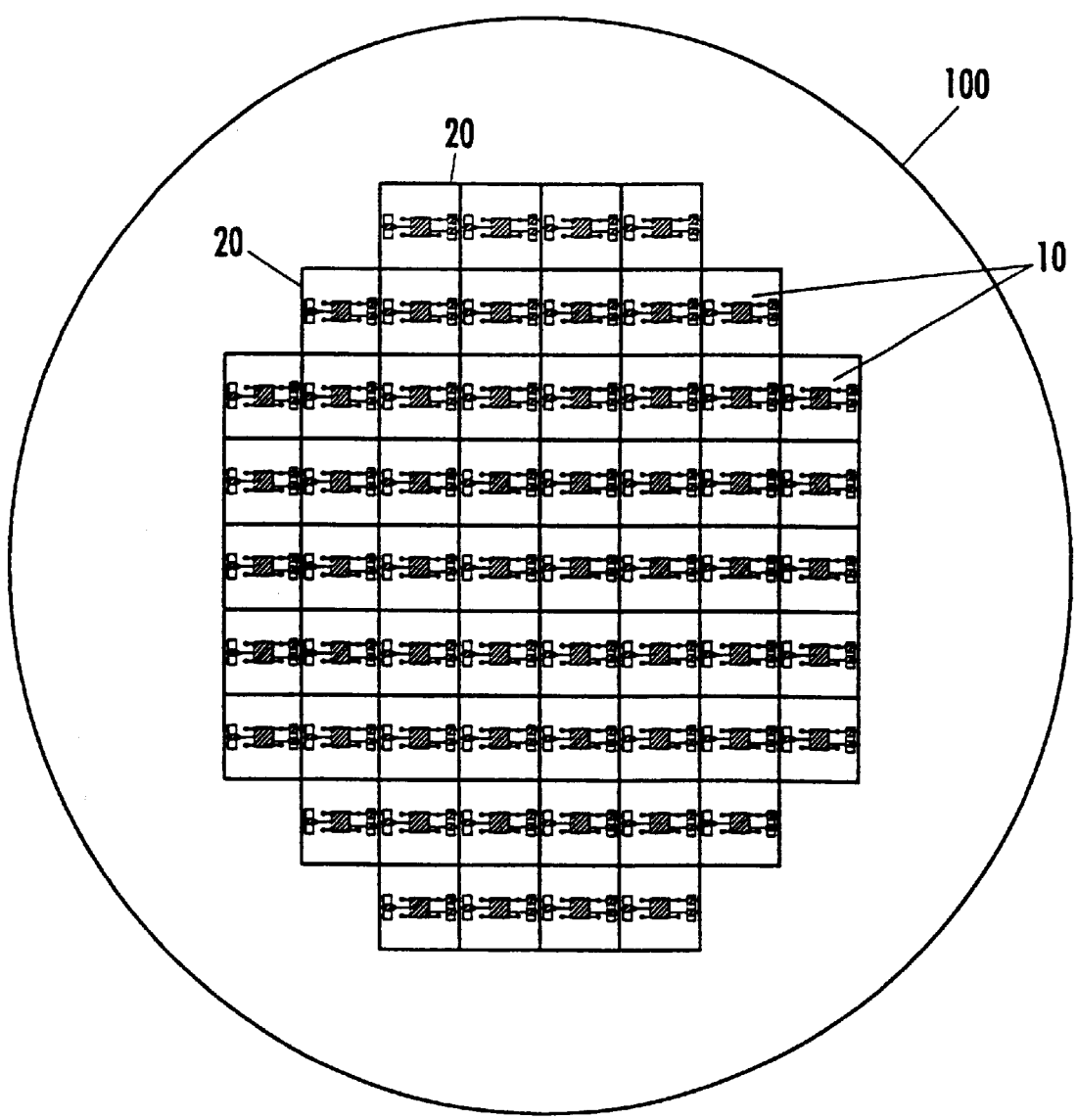
FIG. 8 is a schematic top plan view of a wafer structure including a plurality of multilayer devices with a free mass according to this invention as shown in FIGS. 6 and 7.

In accordance with this invention the upper and lower layers, through their respective electrode or sense plates, are connected not to ground through a complex process, but to a floating point potential. All that is necessary is that the three parts which are in proximity to each other during the anodic bonding be at the same potential so that they are not attracted to one another thereby distorting or deforming the free mass into contact and bonding with one of the layers. The potential that they are connected to for this purpose need not be ground and in fact it is found in accordance with this invention, that it is far more advantageous to not use ground but to simply use a floating point potential or node to connect all three of these layers together. Thus, referring to FIGS. 6 and 7 it can be seen that sense plate 42d is connected through conductor 70d to post 22d and then by conductor 72d to contact 74d. Contact 74d is connected by conductor 76d to scribe line 20d which is conductive. Free mass 18d is connected to all four of its anchors 26d, 26dd, 28d and 28dd. They in turn through conductor 78d are connected to contact pad 80d which in turn is connected to conductor 82d to the same conductive scribe line 20d. Electrode or sense plate 16d is connected through conductor 84d to contact pad 86d which through conductor 88d connects to scribe line 20d. The scribe line 20d is actually the scribe line for saw-cut along which the individual multilayer device chips are cut to dice the wafer. Holes 90 and 92 may be cut in the top wafer to provide access to terminals 74d, 80d and 86d so that these terminals can function as four connections to the outside world. Thus, it can be seen that all three of the effected parts, electrode or sense plates 16d and 42d as well as free mass 18d are all connected to the same potential node, scribe line 20d, during the anodic bonding, without any need for additional processing steps or materials, in order to prevent free mass 18d from being drawn to either electrode 16d or electrode 42d during the anodic bonding process. And after the anodic bonding process is completed a saw cut whose kerf follows 20d by design, cuts all of the connections so that those three parts are no longer electrically connected together or to the same node. The result is that when a wafer such as the triple stack wafer 100, FIG. 8 according to the specific embodiment is diced the cuts along scribe line 20 not only dices the multilayer devices 10 into individual chips but it also severs the electrical connection of the upper and lower support layers and the free mass from each other and the floating potential node constituted by those scribe lines. Triple stack wafer 100 actually includes in the construction of FIG. 8, three individual wafers: one containing layers 12*d*, one containing layers 40*d* and one containing free proof mass structure 17*d*.

Figure 9:
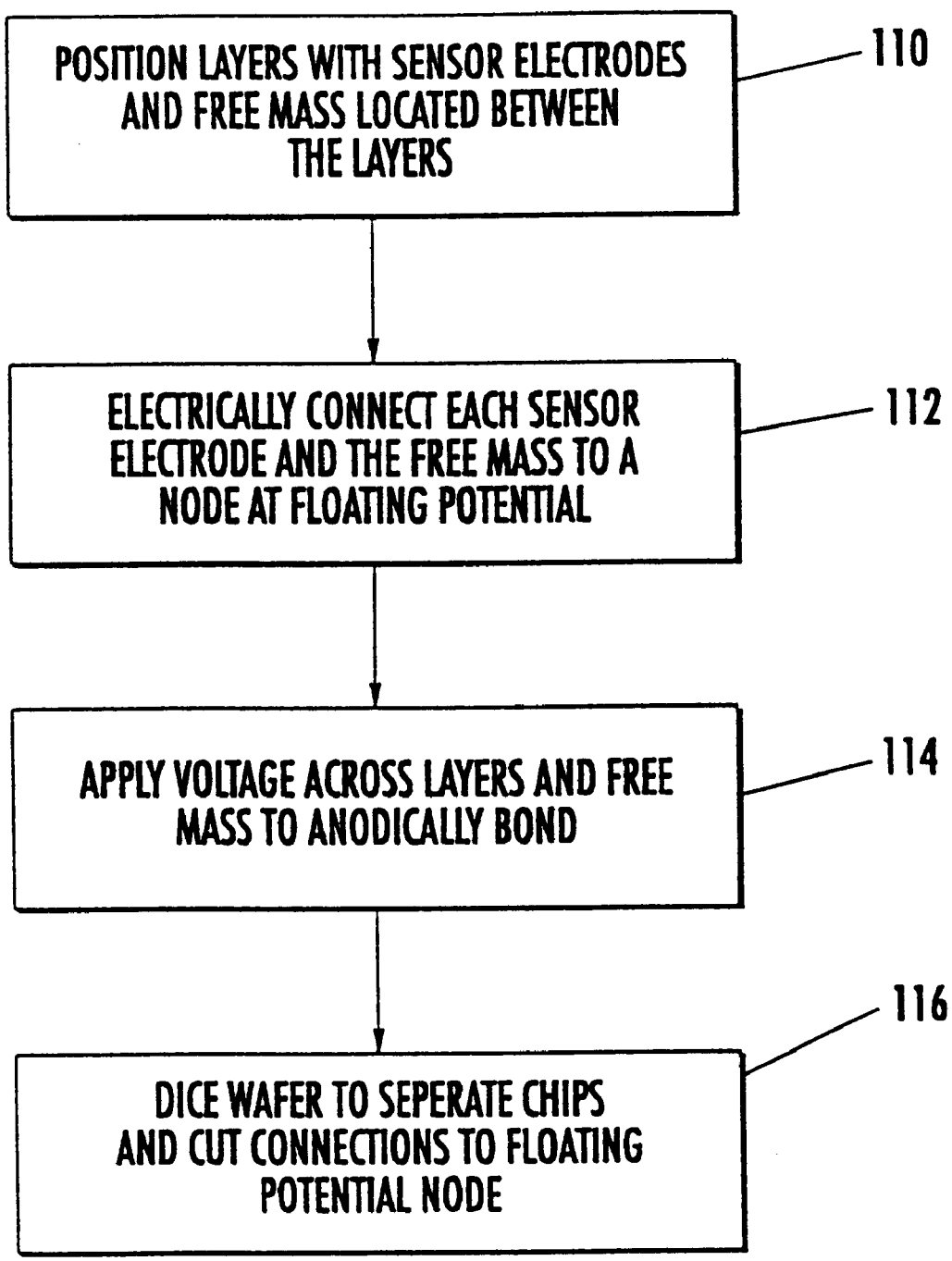
FIG. 9 is a block diagram showing the method of anodically bonding a multilayer device with a free mass according to this invention.

In simple terms the invention according to this invention requires that the upper and lower layers be positioned with their sense electrodes and the free mass structure 17 with the free mass 18 between them, step 110, FIG. 9. Then an electrical connection is made between each electrode or sense plate and/or its layer and the free mass to a node at some floating point potential, not ground, as in step 112. The anodic bonding voltage is then applied across the layers and the free mass structure and free mass in step 114 to anodically bond the layers and free mass anchors after which, if, as is typically but not necessarily the case, a plurality of these multilayer devices were made at once on a wafer, the wafer is diced to separate the devices into separate chips and cut the connections to the floating potential node in step 116.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A method of anodically bonding a multilayer device with a free mass comprising:

positioning at least one support layer on either side of a free mass structure including a free mass with an electrode proximate to the free mass on said at least one support layer;

connecting said electrode and the free mass to a node at a floating potential; and applying a voltage across the at least one layer and free mass structure to bond the at least one support layer to the free mass structure.

2. The method of anodically bonding a multilayer device with a free mass of claim 1 in which said free mass is a proof mass.

3. The method of anodically bonding a multilayer device with a free mass of claim 1 in which said at least one support layer and free mass include different materials.

4. The method of anodically bonding a multilayer device with a free mass of claim 3 in which said at least one support layer includes glass and said free mass includes silicon.

5. The method of anodically bonding a multilayer device with a free mass of claim 1 in which said node is contiguous with said multilayer device.

6. The method of anodically bonding a multilayer device with a free mass of claim 1 in which said multilayer device is one of a plurality formed in a wafer structure.

7. The method of anodically bonding a multilayer device with a free mass of claim 6 in which each said multilayer device has a node associated with it.

8. The method of anodically bonding a multilayer device with a free mass of claim 7 in which said wafer structure is diced into individual multilayer devices and the dicing disconnects the at least one support layer and free mass from said floating potential node.

9. The method of anodically bonding a multilayer device with a free mass of claim 6 in which said wafer structure includes two wafers which form support layers with a third wafer between them forming the free mass structure.

\* \* \* \* \*